(12) United States Patent
Peng

(10) Patent No.: US 7,509,996 B2
(45) Date of Patent: Mar. 31, 2009

(54) HEAT DISSIPATION DEVICE

(75) Inventor: Xue-Wen Peng, Guangdong (CN)

(73) Assignees: Fu Zhun Precision Industry (Shen Zhen) Co., Ltd., Longhua Town, Bao'an District, Shenzhen, Guangdong Providence (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 426 days.

(21) Appl. No.: 11/306,411

(22) Filed: Dec. 27, 2005

(65) Prior Publication Data

US 2007/0147006 A1    Jun. 28, 2007

(51) Int. Cl.
*F28F 7/00* (2006.01)
*F28D 15/00* (2006.01)
*H05K 7/20* (2006.01)

(52) U.S. Cl. ............ 165/80.3; 165/104.21; 165/104.33; 361/700; 361/704

(58) Field of Classification Search ............ 165/104.33, 165/104.21, 80.3, 185, 181; 361/695, 700, 361/704
See application file for complete search history.

(56) References Cited

U.S. PATENT DOCUMENTS

| | | | |
|---|---|---|---|
| 1,943,557 A * | 1/1934 | Ruthenburg et al. ........ | 165/181 |
| 2,475,187 A * | 7/1949 | Kramer ................. | 29/890.046 |
| 2,874,555 A * | 2/1959 | Disinger et al. ............... | 62/525 |
| 5,540,276 A | 7/1996 | Adams | |
| 5,983,995 A * | 11/1999 | Shutou et al. .......... | 165/104.33 |
| 6,779,595 B1 | 8/2004 | Chiang | |
| 6,830,097 B2 | 12/2004 | Wattelet et al. | |
| 6,955,214 B2 * | 10/2005 | Wang ..................... | 165/104.33 |
| 6,978,829 B1 * | 12/2005 | Lin ........................ | 165/104.33 |
| 7,296,617 B2 * | 11/2007 | Lee et al. .................... | 165/80.3 |
| 7,331,379 B2 * | 2/2008 | Chen et al. ............. | 165/104.33 |
| 2004/0194928 A1* | 10/2004 | Lee et al. ............... | 165/104.21 |
| 2005/0257920 A1 | 11/2005 | Sheng | |

\* cited by examiner

*Primary Examiner*—Tho v Duong
(74) *Attorney, Agent, or Firm*—Winston Hsu

(57) ABSTRACT

A heat dissipation device includes a heat spreader (100), a fin assembly (300) located above the heat spreader and a heat pipe (400). The heat spreader has a bottom (110) for contacting a heat-generating component (500) and an upper surface (120) with a groove (122) defined therein. The fin assembly includes a plurality of horizontal fins stacked on each other. The heat pipe includes a first section (410) accommodated in the groove of the heat spreader, a pair of first legs (422) extending from opposite ends of the first section, respectively, and away from the heat spreader, and a second leg (424) bent from each of the first legs towards the heat spreader. The first and second legs pass through the horizontal fins and are fixed to and thermally connected with the horizontal fins.

18 Claims, 6 Drawing Sheets

HEAT DISSIPATION DEVICE

FIELD OF THE INVENTION

The present invention relates to a heat dissipation device, and more particularly to a heat dissipation device including heat sinks and heat pipes for achieving a better heat dissipation efficiency in removing heat from a heat-generating electronic component.

DESCRIPTION OF RELATED ART

As computer technology continues to advance, electronic components such as central processing units (CPUs) of computers are made to provide faster operational speeds and greater functional capabilities. When a CPU operates at a high speed in a computer enclosure, its temperature usually increases enormously. It is desirable to dissipate the generated heat of the CPU quickly.

Conventionally, a heat dissipation device is used to dissipate heat generated by a CPU. Referring to FIG. 6, a conventional heat dissipation device comprises a heat sink 10, a fin assembly 20 located above the heat sink 10, and a U-shaped heat pipe 30 thermally connecting the heat sink 10 and the fin assembly 20. The heat sink 10 comprises a base 12 defining a slot 14 therein, and a plurality of vertical fins 16 extending from the base 12. The fin assembly 20 comprises a plurality of horizontal fins 22 parallelly stacked on each other, and a pair of through holes 24 perpendicularly extending therethrough. The heat pipe 30 comprises an evaporator 32 accommodated in the slot 14 defined in the base 12, and a pair of condensers 34 perpendicularly extending from opposite ends of the evaporator 32 and extending into the corresponding holes 24 defined in the fin assembly 20, respectively. When the heat dissipation device is used, the base 12 contacts with the CPU and absorbs the heat from the CPU. Some of the heat absorbed by the base 12 is transferred to the vertical fins 16 and then to the horizontal fins 22 to create a first heat transfer path, while the other of the heat is transferred to the fin assembly 20 through the heat pipe 30 to create a second heat transfer path. However, only the two condensers 34 of the heat pipe 30 contact with the horizontal fins 22, whereby the contacting area therebetween is limited and the heat absorbed from the heat pipe 30 can not be uniformly distributed over the horizontal fins 22. Thus, the horizontal fins 22 can not be used efficiently to dissipate the heat from the heat pipe 30 to ambient air.

In order to improve the heat dissipation efficiency of the conventional heat dissipation device, a general way is to increase the number of the heat pipe 30 such as two or three to increase the contacting area between the heat pipes 30 and the horizontal fins 22. However, to do so will increase the cost of the conventional heat dissipation device, whereby the conventional heat dissipation device has a low ratio of performance to cost.

What is needed, therefore, is a heat dissipation device with a heat pipe, which has a high ratio of performance to cost.

SUMMARY OF INVENTION

A heat dissipation device comprises a heat spreader, a fin assembly located above the heat spreader and a heat pipe. The heat spreader has a bottom surface for contacting a heat-generating component and an upper surface with a groove defined therein. The fin assembly comprises a plurality of horizontal fins stacked on each other. The heat pipe comprises a first section accommodated in the groove of the heat spreader, a pair of first legs extending from opposite ends of the first section and away from the heat spreader, and a second leg bent downwardly from one of the first legs towards the heat spreader. The first and second legs extend through the horizontal fins and are fixed to and thermally connected with the horizontal fins.

Other advantages and novel features will become more apparent from the following detailed description of preferred embodiments when taken in conjunction with the accompanying drawings, in which:

DETAILED DESCRIPTION

Figure 1:
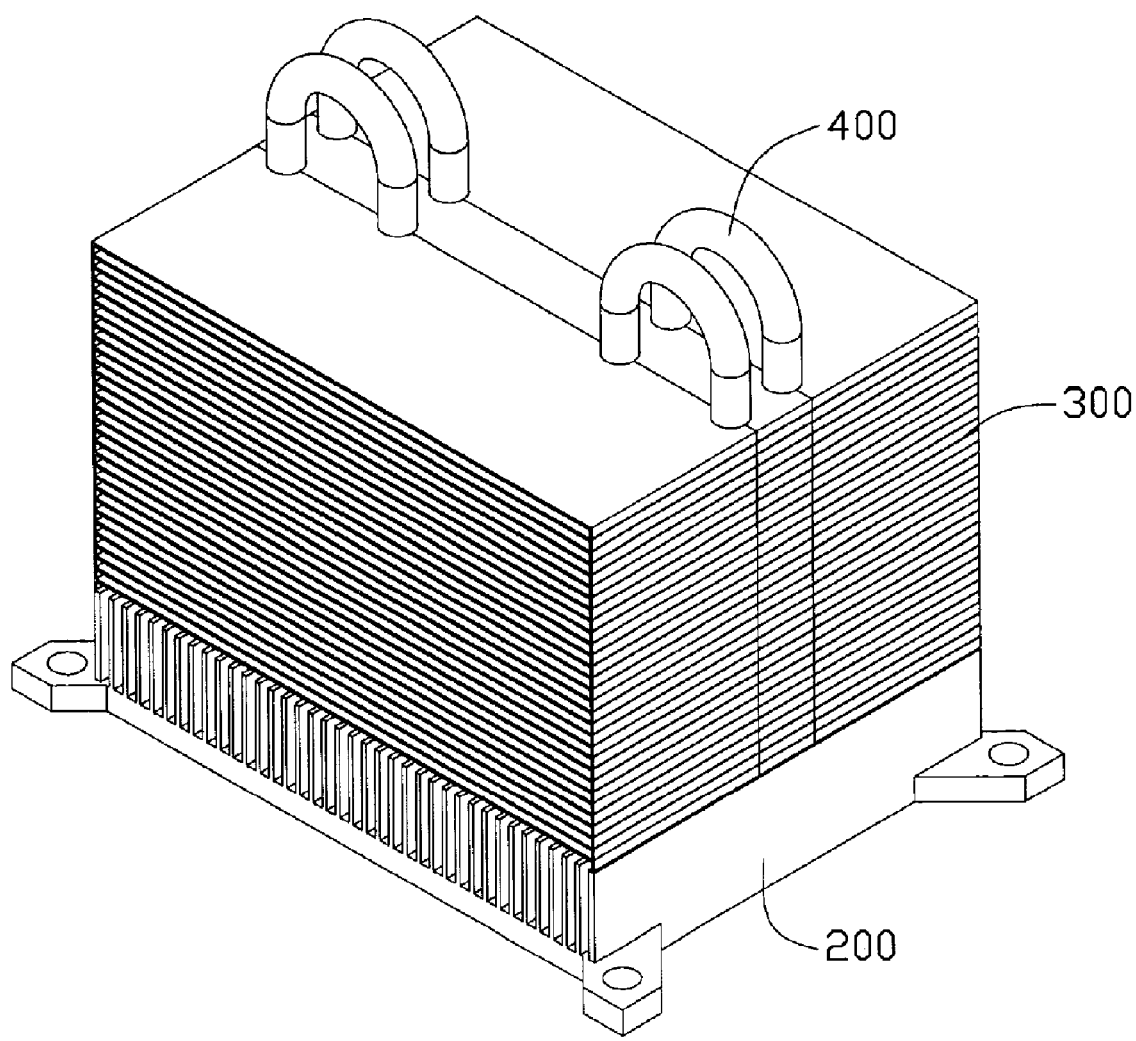
FIG. 1 is an assembled view of a heat dissipation device in accordance with a preferred embodiment of the present invention.
Figure 2:
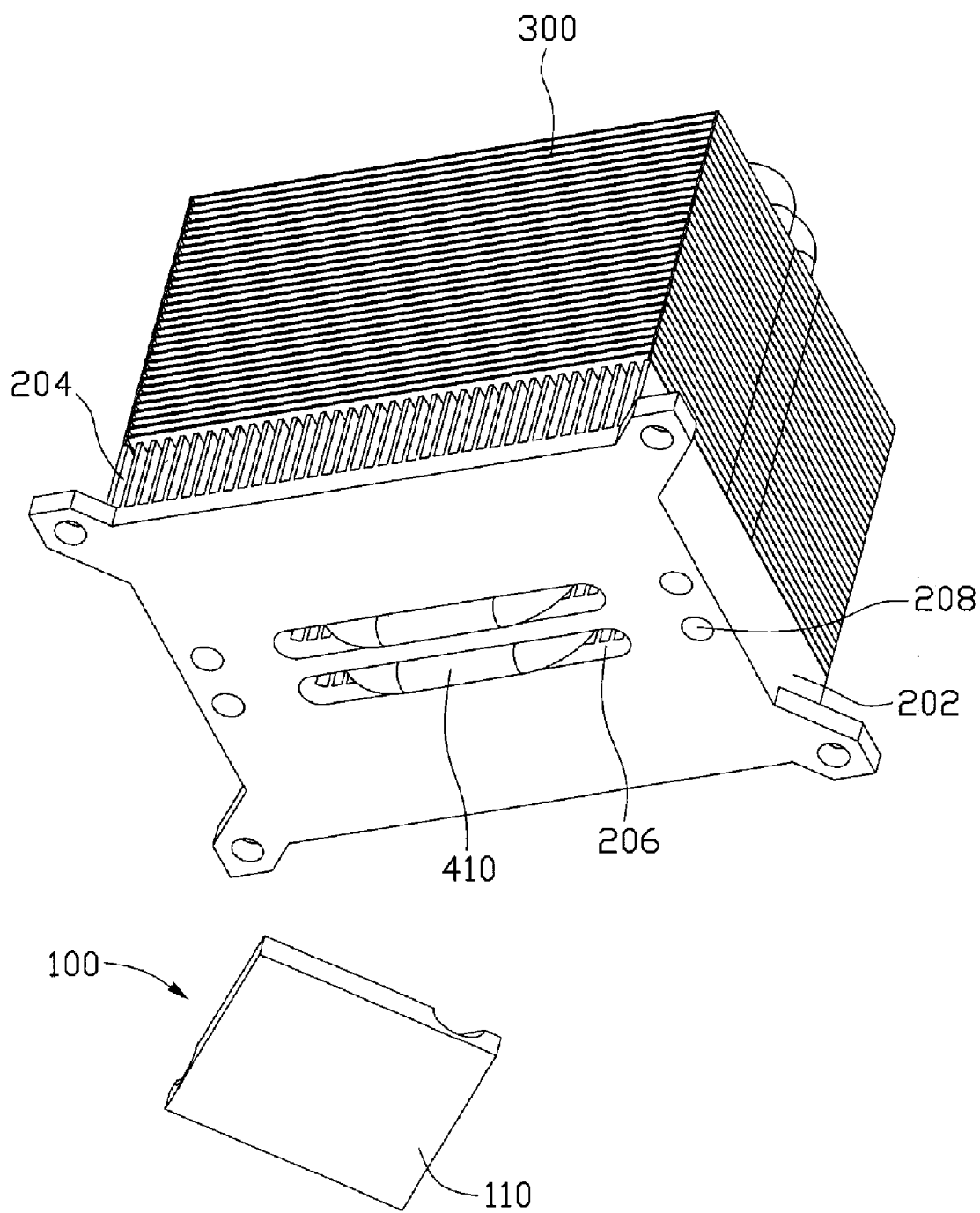
FIG. 2 is a partially exploded view of FIG. 1 to show a bottom structure of a heat sink of the heat dissipation device.
Figure 3:
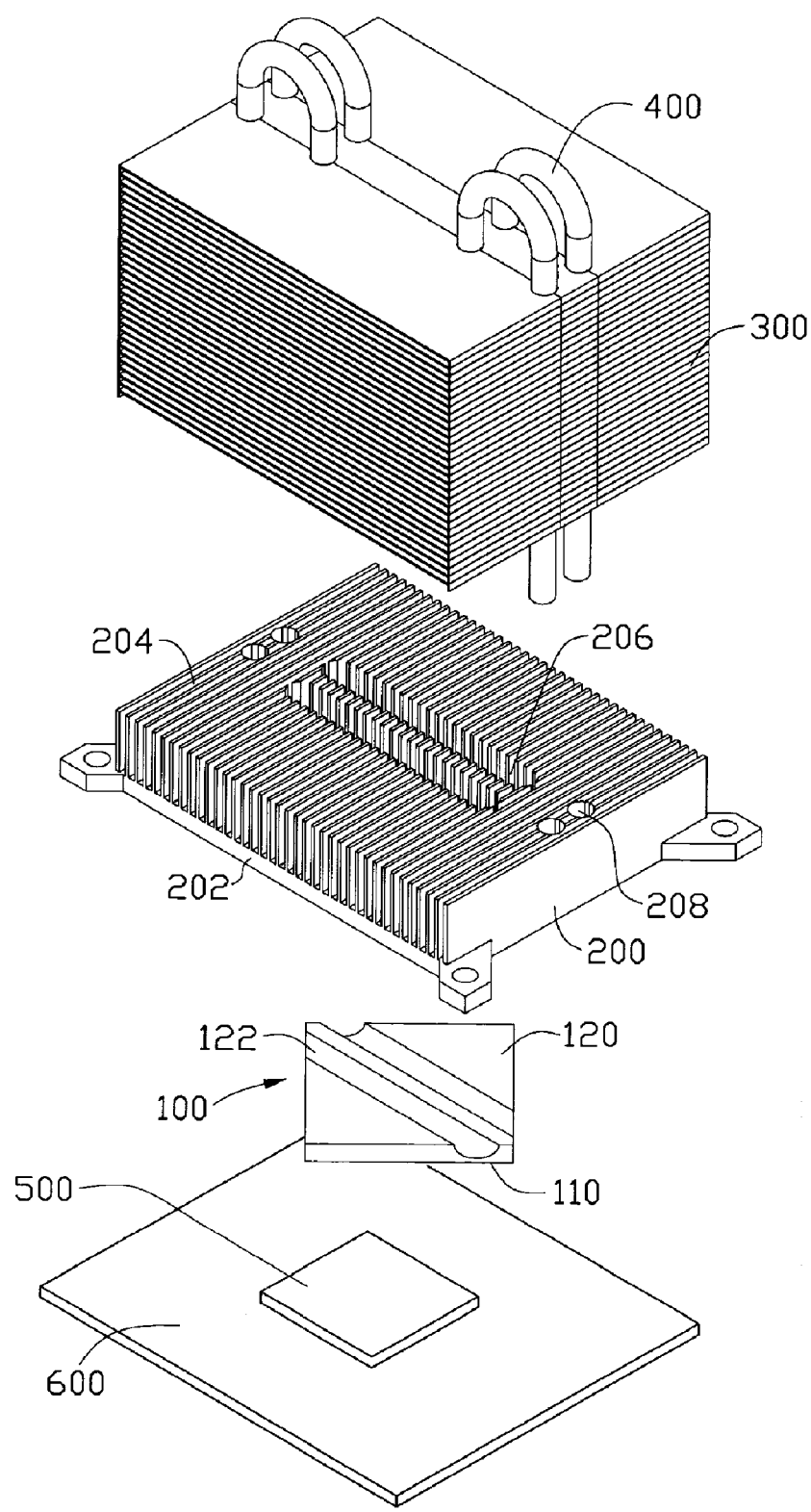
FIG. 3 is an exploded view of the heat dissipation device of FIG. 1, and a printed circuit board having a heat-generating component mounted thereon.

Referring to FIGS. 1-3, a heat dissipation device in accordance with a preferred embodiment of the invention comprises a rectangle heat spreader 100, a heat sink 200 mounted on the heat spreader 100, a fin assembly 300 and a heat conductive member such as a pair of serpentine heat pipes 400 thermally connecting the base 100, the heat sink 200 and the fin assembly 300 together. The heat spreader 100 and the heat sink 200 are made of a heat conductive material, such as copper or aluminum. Specifically, the heat spreader 100 is made of copper while the heat sink 200 is made by aluminum extrusion, since the heat spreader 100 is used to directly contact with a heat generating electronic component such as a CPU 500, which preferably has a higher thermal conductivity. Copper has a higher thermal conductivity than aluminum, but is expansive than aluminum.

The heat spreader 100 comprises a bottom surface 110 for contacting with the CPU 500 mounted on a printed circuit board 600, and an upper surface 120 having a pair of parallel grooves 122 diagonally defined therein.

The heat sink 200 comprises a base 202 facing the upper surface 120 of the heat spreader 100, and a plurality of vertical fins 204 extending upwardly from the base 202. A pair of parallel slots 206 corresponding to the grooves 122 of the heat spreader 100 is defined through the heat sink 200 and provides a void for the heat pipes 400 passing through. Two pairs of through holes 208 are respectively defined through the heat sink 200 beside opposite sides of the corresponding slots 206, respectively.

Figure 4:
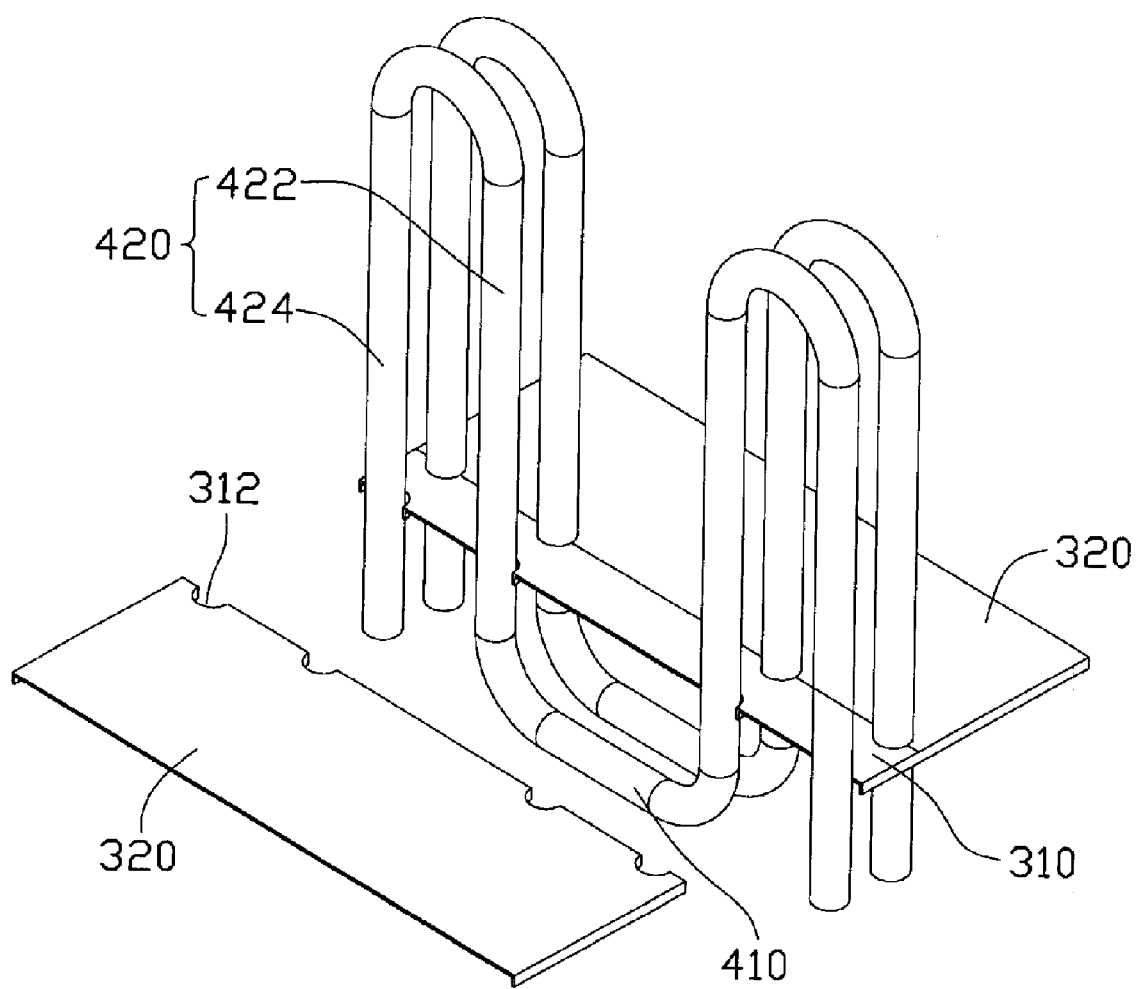
FIG. 4 is a partially assembled view of two heat pipes and three flakes of a horizontal fin of the heat dissipation device of FIG. 1.

Referring also to FIG. 4, each of the serpentine heat pipes 400 comprises a first section 410 and a pair of second sections 420 formed at opposite ends of the first section 410. The second sections 420 comprise a pair of first legs 422 extending perpendicularly upwardly from opposite ends of the first section 410 respectively, and a pair of second legs 424 downwardly bent from and parallel to the first legs 422 respectively. Free ends of the second legs 424 are inserted into the corresponding holes 208 defined in the heat sink 200. Thus, each second section 420 has an inverted U-shaped configuration. The first sections 410 are constructed as evaporators of the heat pipes 400, which pass through the slots 206 defined in the heat sink 200 and are accommodated in the grooves 122 of the heat spreader 100 to absorb heat therefrom. The second sections 420 are constructed as condensers of the heat pipes 400, which are used for dissipating the heat transferred from the first sections 410 to the fin assembly 300. The heat absorbed by the first sections 410 is quickly transferred to the fin assembly 300 through the first and second legs 422,424 of the second sections 420 and uniformly distributed over the fin assembly 300.

Figure 5:
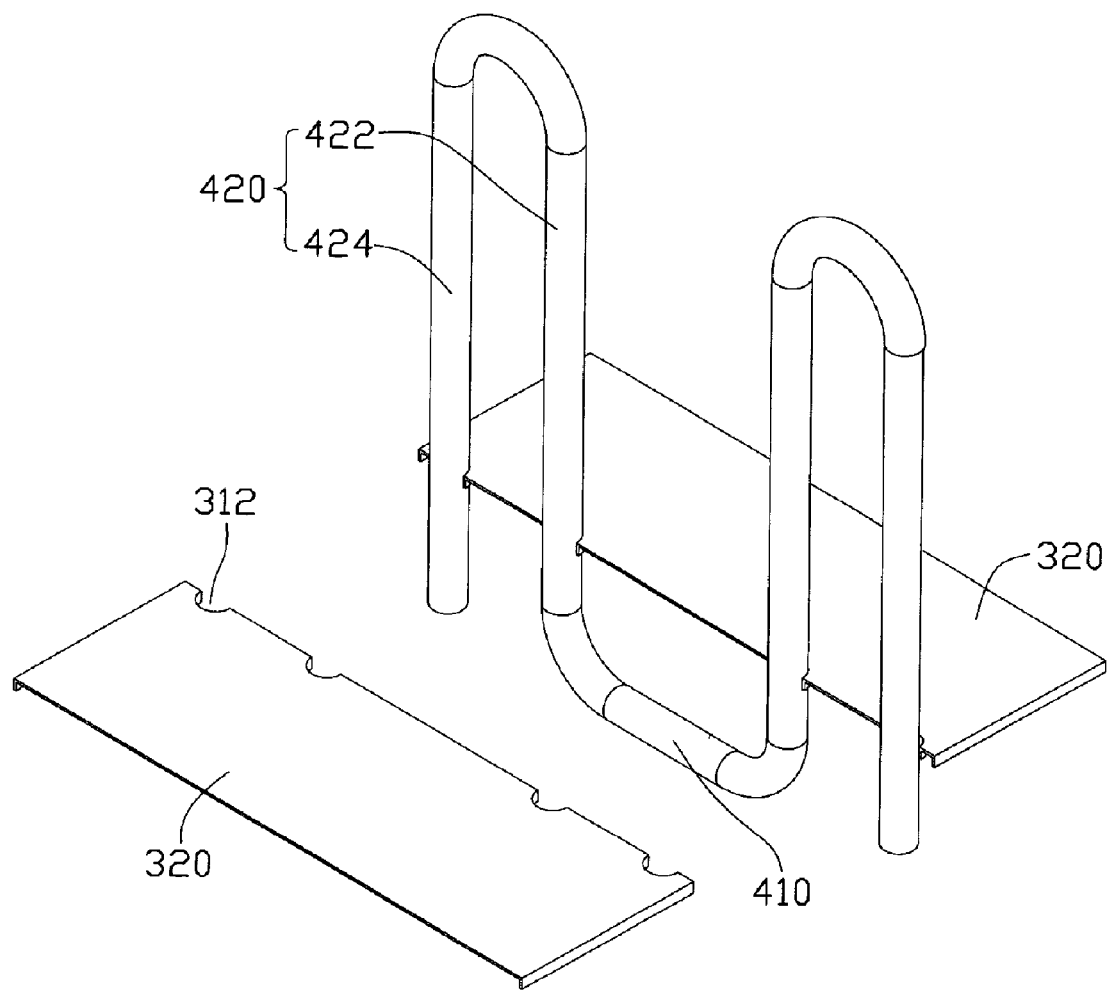
FIG. 5 is similar to FIG. 4, but showing one heat pipe and a pair of flakes of a horizontal fin of a heat dissipation device in accordance with an alternative embodiment of the present invention.
Figure 6:
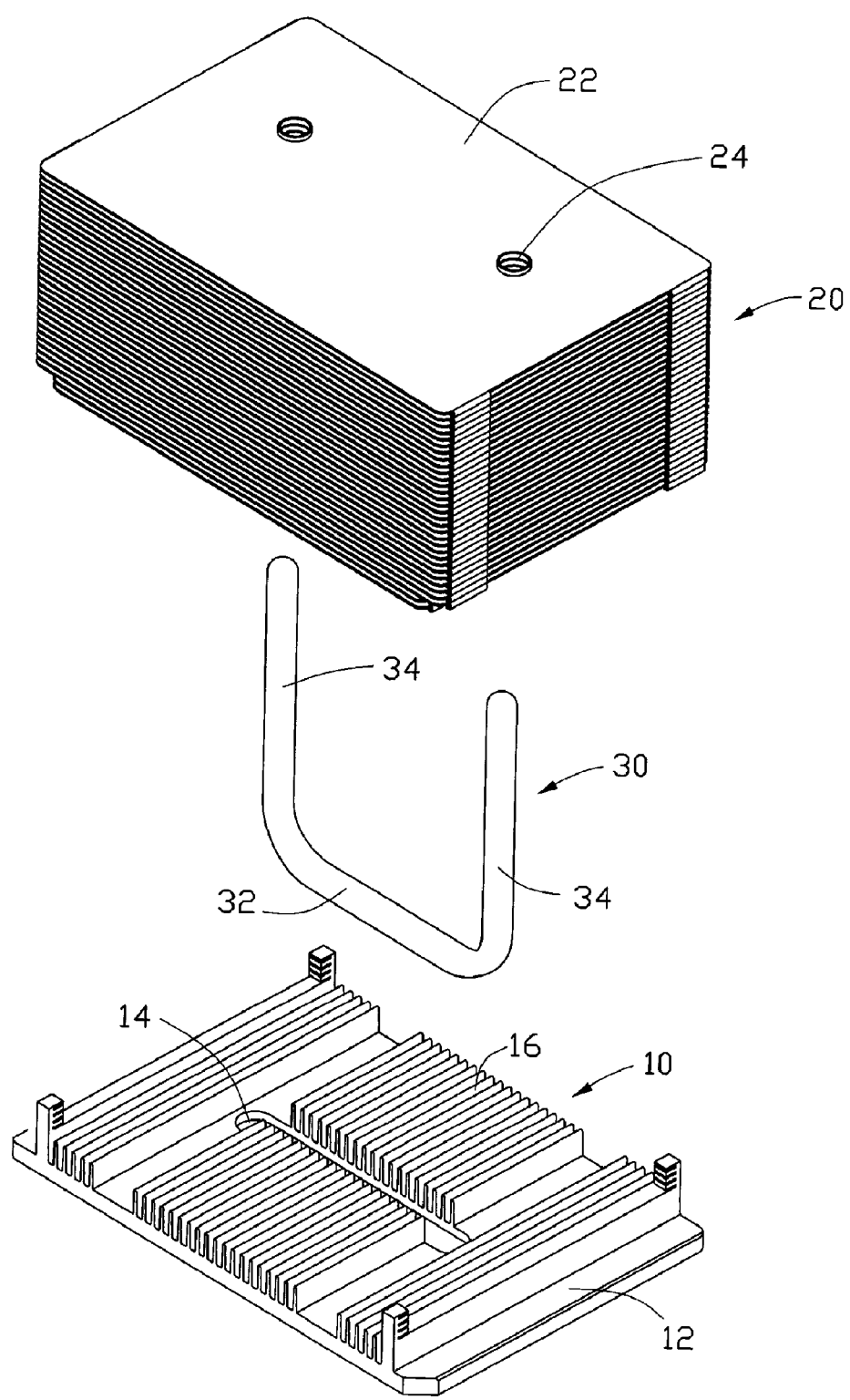
FIG. 6 is an isometric view of a conventional heat dissipation device.

The fin assembly 300 is mounted on the second sections 420 of the heat pipes 400 and located above the heat sink 200. The fin assembly 300 comprises a plurality of horizontal fins (not labeled) parallelly stacked on each other. Referring also to FIGS. 4-5, each horizontal fin comprises a first flake 310 sandwiched between the two heat pipes 400, and a pair of second flakes 320 located at opposite sides of the first flake 310 and contacting the heat pipes 400 respectively. A plurality of semicircular flanges 312 is formed on adjacent edges of the first and second flakes 310,320. When the first and second flakes 310, 320 are assembled together to form the horizontal fin, the semicircular flanges 312 form a plurality of circular passages at joints (not labeled) of the first and second flakes 310, 320. The first and second legs 422,424 of the second sections 420 of the heat pipes 400 extend through the circular passages and are fixed therein by a known joint mechanism such as soldering, which can attain both thermal and mechanical connection. In this manner, all the horizontal fins are fixed on the first and second legs 422,424 of heat pipes 400, and the fin assembly 300 is formed.

In the preferred embodiment, the connections between the heat spreader 100 and the base 202, between the heat spreader 100 and the heat pipes 400, between the heat pipes 400 and the base 202, and between the heat pipes 400 and the horizontal fins are achieved by the known joint mechanism, i.e., soldering.

In operation of the heat dissipation device of the preferred embodiment of the invention, the heat generated by the CPU 500 is absorbed by the heat spreader 100. Some of the heat absorbed by the spreader 100 is directly transferred to the base 202 and then to the vertical fins 204 and finally to the horizontal fins to be dissipated. The other of the heat absorbed by the spreader 100 is transferred to the first sections 410 of the heat pipes 400, and then is quickly transferred to all of the horizontal fins of the fin assembly 300 by the first and second legs 422, 424 of the second sections 420 of the heat pipes 400. The heat is uniformly spread over the horizontal fins since each heat pipe 400 has four dissipation sections contacting with the horizontal fins. So, a uniform temperature distribution in the whole fin assembly 300 is achieved. This avails to improve the efficiency of utilization of the fin assembly 300 to dissipate the heat to ambient air.

Each heat pipe 400 has four legs 422, 424 contacting with the horizontal fins; the contacting area between each heat pipe 400 and the horizontal fins is the same as that of using two U-shaped heat pipes. The heat transfer efficiency of each heat pipe 400 is almost the same as that of using two U-shaped heat pipes. Furthermore, the cost of the two U-shaped heat pipes is much higher than that of each heat pipe 400. Therefore, the heat dissipation device of the present invention has a better ratio regarding performance to cost.

It can be understood that the number of the heat pipes 400 is a matter of design choice, which can be one, two, three or more. Referring to FIG. 5, when only one heat pipe 400 is used, each horizontal fin only comprises the pair of the second flakes 320, and the semicircular flanges 312 of the second flakes 320 together form a plurality of circular passages for the first and second legs 422,424 of heat pipe 400 extending therethrough and fixed therein. When three or more heat pipes 400 are used, each horizontal fin will comprise two or more of the first flake 310 disposed between adjacent heat pipes 400, and the pair of the second flakes 320 located at opposite sides of the outermost first flakes 310. Other components can be referenced to the description of the preferred embodiment of FIGS. 1-4 and are omitted herewith.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat spreader for contacting a heat-generating component;
   a fin assembly located above the heat spreader, the fin assembly comprising a plurality of horizontal fins stacked on each other;
   a heat pipe comprising a first section thermally contacting with the heat spreader, a pair of first legs extending from opposite ends of the first section, respectively, and away from the heat spreader, and a second leg bent from one of the first legs towards the heat spreader, the first and second legs extending through the horizontal fins and having the horizontal fins mounted thereon; and
   a heat sink sandwiched between the heat spreader and the fin assembly.

2. The heat dissipation device as claimed in claim 1, wherein the heat pipe further comprises another second leg bent from the other first leg towards the heat spreader and passing through the horizontal fins.

3. The heat dissipation device as claimed in claim 1, wherein the heat sink comprises a base facing the heat spreader, a plurality of fins extending from the base, a slot defined through the heat sink to provide a void for the heat pipes passing through to contact with the heat spreader, a pair of holes defined beside opposite sides of the slot to receive free ends of the second legs.

4. The heat dissipation device as claimed in claim 3, wherein a groove is diagonally defined in the heat spreader, and the first section of the heat pipe passes through the slot defined in the heat sink and is accommodated in the groove.

5. The heat dissipation device as claimed in claim 1, wherein each horizontal fin comprises a pair of flakes each having a plurality of semicircular flanges, the semicircular flanges of the flakes together form a plurality of circular passages for the first and second legs of heat pipe extending therethrough and fixed therein.

6. The heat dissipation device as claimed in claim 1, further comprising another heat pipe thermally connecting the heat spreader and the fin assembly together, the another heat pipe comprises a first section thermally contacting with the heat spreader, a pair of first legs extending from opposite ends of the first section, respectively, and away from the heat spreader, and a second leg bent from each of the first legs towards the heat spreader, the first and second legs extending through the horizontal fins and having the horizontal fins mounted thereon.

7. The heat dissipation device as claimed in claim 6, wherein each horizontal fin comprises a first flake sandwiched between the two heat pipes, and a pair of second flakes located at opposite sides of the first flake and contacting the heat pipes respectively.

8. The heat dissipation device as claimed in claim 7, wherein a plurality of semicircular flanges is formed on adjacent edges of the first and second flakes, and the semicircular flanges form a plurality of circular passages on joints of the first and second flakes for the first and second legs of heat pipes extending therethrough and fixed therein.

9. A heat dissipation device comprising:
a heat spreader having a bottom surface for contacting with a heat-generating component and an upper surface having a groove defined therein;
a heat pipe comprising an evaporator accommodated in the groove of the heat spreader, a pair of inverted U-shaped condensers formed at opposite ends of the evaporator, respectively, and away from the heat spreader;
a fin assembly located above the heat spreader, the fin assembly comprising a plurality of horizontal fins stacked on each other and mounted on the inverted U-shaped condensers of the heat pipe; and
a heat sink sandwiched between the heat spreader and the fin assembly.

10. The heat dissipation device as claimed in claim 9, wherein the heat sink comprises a base facing the upper surface of the heat spreader, a plurality of fins extending from the base, a slot defined through the heat sink to provide a void for the heat pipe passing through and accommodated in the groove, a pair of holes defined beside opposite sides of the slot to receive free ends of the inverted U-shaped condensers of the heat pipe.

11. The heat dissipation device as claimed in claim 9, wherein each horizontal fin comprises a pair of flakes each having a plurality of semicircular flanges, the semicircular flanges of the flakes together form a plurality of circular passages for the inverted U-shaped condensers of the heat pipe extending therethrough and fixed therein.

12. The heat dissipation device as claimed in claim 9, further comprising another heat pipe, and the another heat pipe comprises an evaporator and a condenser thermally connecting the heat spreader and the fin assembly respectively.

13. The heat dissipation device as claimed in claim 12, wherein each horizontal fin comprises a first flake sandwiched between the two heat pipes, and a pair of second flakes located at opposite sides of the first flake and contacting the heat pipes respectively.

14. The heat dissipation device as claimed in claim 13, wherein a plurality of semicircular flanges is formed on adjacent edges of the first and second flakes, and the semicircular flanges form a plurality of circular passages on opposite edges of the first flake for the condensers of the heat pipes extending therethrough and fixed therein.

15. A heat dissipation device comprising:
a serpentine heat pipe having a horizontal section adapted for thermally connecting with a heat generating electronic component and two parallel vertical sections extending from each of two ends of the horizontal section;
a fin assembly having a plurality of horizontal fins through which the two parallel vertical sections of the heat pipe extend, wherein the two parallel vertical sections are fixed to and thermally connect with the horizontal fins; and
a heat sink having a base defining a slot receiving the horizontal section of the heat pipe and a plurality of fins extending toward the fin assembly.

16. The heat dissipation device of claim 15, wherein each of the horizontal fins comprises a plurality of flakes connected together.

17. The heat dissipation device of claim 15 further comprising a heat spreader fixed to a bottom surface of the heat sink and thermally connecting with horizontal section of the heat pipe.

18. The heat dissipation device of claim 17, wherein the heat spreader is made of copper and defines a groove extending diagonally therein, the groove receiving the horizontal section of the heat pipe therein.

* * * * *